United States Patent
Boyle et al.

(10) Patent No.: US 7,666,513 B2
(45) Date of Patent: Feb. 23, 2010

(54) ADHESIVE OF A SILICON AND SILICA COMPOSITE FOR BONDING TOGETHER SILICON PARTS

(75) Inventors: James E. Boyle, Saratoga, CA (US); Raanan Zehavi, Sunnyvale, CA (US); Amnon Chalzel, Sunnyvale, CA (US)

(73) Assignee: Integrated Materials, Inc., Sunnyvale, CA (US)

( * ) Notice: Subject to any disclaimer, the term of this patent is extended or adjusted under 35 U.S.C. 154(b) by 47 days.

(21) Appl. No.: 11/444,560

(22) Filed: Jun. 1, 2006

(65) Prior Publication Data

US 2006/0213601 A1  Sep. 28, 2006

Related U.S. Application Data

(62) Division of application No. 10/670,990, filed on Sep. 25, 2003, now Pat. No. 7,083,694.
(60) Provisional application No. 60/465,021, filed on Apr. 23, 2003.

(51) Int. Cl.
| | |
|---|---|
| *B32B 9/04* | (2006.01) |
| *B32B 13/04* | (2006.01) |
| *B32B 17/06* | (2006.01) |
| *B65D 85/48* | (2006.01) |
| *A47G 19/08* | (2006.01) |
| *F27D 5/00* | (2006.01) |

(52) U.S. Cl. ............... 428/446; 206/454; 211/41.18; 428/426; 428/428; 428/448; 432/258
(58) Field of Classification Search .......... 156/48, 156/329, 89.11; 501/4, 53, 95.2, 154; 428/208, 428/317.1–317.9, 318.4, 318.6, 312.6, 426, 428/428, 446, 448; 427/219; 206/454; 211/41.18; 432/253, 258
See application file for complete search history.

(56) References Cited

U.S. PATENT DOCUMENTS

| | | | | |
|---|---|---|---|---|
| 3,273,957 A | 9/1966 | Beredjick | .................... | 422/43 |
| 3,707,386 A | 12/1972 | Kurz | .......................... | 106/631 |
| 3,833,348 A | 9/1974 | Stokes et al. | .................... | 65/43 |
| 4,541,035 A | 9/1985 | Carlson et al. | .............. | 361/792 |
| 5,795,813 A * | 8/1998 | Hughes et al. | .............. | 438/423 |

(Continued)

FOREIGN PATENT DOCUMENTS

| | | |
|---|---|---|
| JP | 55-163702 | 12/1980 |
| JP | 05-175319 | 7/1993 |

OTHER PUBLICATIONS

Pauthe et al., "Preperation and Charachterization of Si nanocrystallites embedded in a silica matrix" J. Matr. Chem., 1999, Issue 9, pp. 187-191.*
Nicklaw et al., "Defects and Nanocrystals Generated by Si Implantation into a-SIO2". Transactions on Nuclear Science, col. 47, No. 6, pp. 2269-2275. (2000).*
Yamada et al. "SOI by Wafer Bonding with Spin-on-Glass as Adhesive", Electronic Letters. col. 23. nol. 1. pp. 39-40. (1987).*

(Continued)

*Primary Examiner*—Timothy M Speer
*Assistant Examiner*—Jonathan C Langman
(74) *Attorney, Agent, or Firm*—Charles S. Guenzer

(57) ABSTRACT

A method of joining two silicon members, the adhesive used for the method, and the joined product, especially a silicon tower for supporting multiple silicon wafers. A flowable adhesive is prepared comprising silicon particles of size less than 100 μm and preferably less than 100 nm and a silica bridging agent, such as a spin-on glass. Nano-silicon crystallites of about 20 nm size may be formed by CVD. Larger particles may be milled from virgin polysilicon. If necessary, a retardant such as a heavy, preferably water-insoluble alcohol such as terpineol is added to slow setting of the adhesive at room temperature. The mixture is applied to the joining areas. The silicon parts are assembled and annealed at a temperature sufficient to link the silica, preferably at 900° C. to 1100° C. for nano-silicon but higher for milled silicon.

12 Claims, 4 Drawing Sheets

U.S. PATENT DOCUMENTS

| | | | |
|---|---|---|---|
| 5,945,475 A | 8/1999 | Yamada et al. | 524/588 |
| 6,004,866 A | 12/1999 | Nakao et al. | 438/459 |
| 6,051,452 A | 4/2000 | Shigyo et al. | 435/287.1 |
| 6,056,123 A | 5/2000 | Niemirowski et al. | 206/711 |
| 6,099,302 A | 8/2000 | Hong et al. | 432/259 |
| 6,145,673 A | 11/2000 | Burrows et al. | 211/41.18 |
| 6,157,047 A * | 12/2000 | Fujita et al. | 257/51 |
| 6,225,154 B1 * | 5/2001 | Allman | 438/231 |
| 6,239,004 B1 | 5/2001 | Aga et al. | 438/455 |
| 6,450,346 B1 | 9/2002 | Boyle et al. | 211/41.18 |
| 6,455,395 B1 | 9/2002 | Boyle et al. | 438/455 |
| 6,528,391 B1 | 3/2003 | Henley et al. | 438/459 |
| 6,544,864 B2 | 4/2003 | Reeder et al. | 438/455 |
| 6,603,651 B2 | 8/2003 | Kosakai et al. | 361/234 |
| 6,787,195 B2 | 9/2004 | Wang et al. | 427/452 |
| 6,832,716 B2 | 12/2004 | Canham et al. | 228/262.2 |
| 2001/0000335 A1 * | 4/2001 | Yamada et al. | 438/1 |
| 2002/0149082 A1 | 10/2002 | Nagano et al. | 257/516 |

OTHER PUBLICATIONS

Wang et al. "Gettign Highefficiency photoluminescence from Si-Nanocrystals in SiO2 matrix" Applied Physics Letters. vol. 41. No. 22., (Nov. 2002).*

Lin et al., "Impact of PECVD oxide charchteristics of interconnect via resistance and device performance of four transitor static random access memory with polysilicon load resistors". J.Vac.Sci. Technol. B. vol.17., issue 4, pp. 1456-1463. (1999).*

Shimizu-Iwayama et al. "Correlation of Microstructure and Photoluminescence for Nanometer-Sized Si Crystals Formed in an Amorphous SiO2 Matrix by Ion Implantation" NanoStructured Materials, vol. 5, No. 3, pp. 307-318. (1995).*

Lowery et al., "Cutting large optics costs with planform bonding", *Photonics Spectra*, Apr. 1992, pp. 159-161.

Mark J. Loboda et al., "Understanding hydrogen silsesquioxane-based dielectric film processing", *Solid State Technology*, May 1998, pp. 1-4.

"Nanotoxicity of nanomaterials?", *Chemistry*, Autumn 2003, p. 5.

* cited by examiner

ADHESIVE OF A SILICON AND SILICA COMPOSITE FOR BONDING TOGETHER SILICON PARTS

RELATED APPLICATION

This application is a division of Ser. No. 10/670,990, filed Sep. 25, 2003, now issued as U.S. Pat. No. 7,083,694, which claims benefit of provisional application 60/465,021, filed Apr. 23, 2003.

BACKGROUND OF THE INVENTION

1. Field of the Invention

The invention relates generally to curable silicon-based adhesives. In particular, the invention relates to joining silicon parts used in semiconductor fabrication equipment.

2. Background Art

Batch substrate processing continues to be used in fabricating semiconductor integrated circuits and similar micro structural arrays. In batch processing, many silicon wafers or other types of substrates are placed together on a wafer support fixture in a processing chamber and simultaneously processed. Currently, most batch processing includes extended exposure to high temperature, for example, in depositing planar layers of oxide or nitride or annealing previously deposited layers or dopants implanted into existing layers. Although horizontally arranged wafer boats were originally used, vertically arranged wafer towers are now mostly used as the support fixture to support many wafers one above the other.

In the past, the towers have been most often made of quartz or sometimes of silicon carbide for high-temperature applications. However, quartz and silicon carbide have proven unsatisfactory for many advanced processes. An acceptable yield of advanced integrated circuits depends upon a very low level of particles and metallic contaminants in the processing environment. The quartz towers often develop excessive particles after a few cycles and must be reconditioned or discarded. Furthermore, many processes require high-temperature processing at above 1000° C. or even above 1250° C. Quartz sags at these high temperatures although silicon carbide maintains its strength to a much higher temperature. However, the high temperature activates the diffusion of impurities from either the quartz or silicon carbide into the semiconductor silicon. Some of the problems with silicon carbide have been solved by coating a sintered SiC structure with a thin SiC surface layer deposited by chemical vapor deposition (CVD). This approach, despite its expense, has its own problems. Integrated circuits having features sizes of 0.13 µm and below often fail because slip defects develop in the silicon wafer. It is believed that slip develops during initial thermal processing when the silicon wafers are supported on towers of a material having a different thermal expansion than silicon.

Many of these problems have been solved by the use of silicon towers, particularly those made of virgin polysilicon, as described by Boyle et al. in U.S. Pat. No. 6,450,346, incorporated herein by reference in its entirety. A silicon tower 10, illustrated orthographically in FIG. 1, includes three or more silicon legs 12 joined at their ends to two silicon bases 14. Each leg 12 is cut with slots to form inwardly projecting teeth 16 which slope upwards by a few degrees and have horizontal support surfaces 18 formed near their inner tips 20. A plurality of wafers 22, only one of which is illustrated, are supported on the support surfaces 18 in parallel orientation along the axis of the tower 10. For very high-temperature processing, it is preferred that there be four legs 12 and that the support surfaces 18 be arranged in a square pattern at 0.707 of the wafer radius from the center.

Superior results are obtained if the legs 12 are machined from virgin polysilicon, which is silicon formed by chemical vapor deposition from a gaseous precursor, typically silane ($SiH_4$) or a chlorosilane ($SiClH_3$, $SiCl_2H_2$, $SiCl_3H$, or $SiCl_4$). Virgin polysilicon (virgin poly) is the precursor material used for the Czochralski growth of silicon ingots from which wafers are cut. It has an exceedingly low level of impurities. Although virgin poly would be the preferred material for the bases 14, it is not usually available in such large sizes. Instead, Czochralski or cast silicon may be used for the bases. Their higher impurity level is of lesser importance since the bases 14 do not contact the wafers 22.

Fabricating a silicon tower particularly out of virgin poly requires several separate steps, one of which is joining the machined legs 12 to the bases 14. As schematically illustrated in FIG. 2, mortise holes 24, which are preferably blind but may be through, are machined into each base 14 with shapes in correspondence with and only slightly larger than ends 26 of the legs 12. Boyle et al. favor the use of a spin-on glass (SOG) that has been thinned with an alcohol or the like. The SOG is applied to one or both of the members in the area to the joined. The members are assembled and then annealed at 600° C. or above to vitrify the SOG in the seam between the members.

SOG is widely used in the semiconductor industry for forming thin inter-layer dielectric layers so that it is commercially available at relatively low expense and of fairly high purity. SOG is a generic term for chemicals widely used in semiconductor fabrication to form silicate glass layers on integrated circuits. Commercial suppliers include Allied Signal, Filmtronics of Butler, Pa., and Dow Corning. SOG precursors include one or more chemicals containing both silicon and oxygen as well as hydrogen and possibly other constituents. An example of such as precursor is tetraethylorthosilicate (TEOS) or its modifications or an organo-silane such as siloxane or silsesquioxane. When used in an adhesive, it is preferred that the SOG not contain boron or phosphorous, as is sometimes done for integrated circuits. The silicon and oxygen containing chemical is dissolved in an evaporable liquid carrier, such as an alcohol, methyl isobutyl ketone, or a volatile methyl siloxane blend. The SOG precursor acts as a silica bridging agent in that the precursor chemically reacts, particularly at elevated temperature, to form a silica network having the approximate composition of $SiO_2$.

It is believed that the process produces the structure illustrated very schematically in cross section in FIG. 3. Two silicon members 30, 32 are separated by a gap 34 having a thickness of about 50 µm (2 mils). The thickness of the gap 34 represents an average separation of the leg 12 and the base 14 of FIG. 2 as the end 26 of the leg 12 is at least slidably fit in the mortise hole 24. The gap thickness cannot be easily further reduced because of the machining required to form the complex shapes that guarantee alignment and because some flexing of assembled members is needed to allow precise alignment of the support surfaces and other parts. A coating of SOG is applied to at least one of the mating surfaces before the two members 30, 32 are assembled such that the SOG fills the gap 34 of FIG. 3. Following curing and a vitrification anneal, the SOG forms a silicate glass 36 that is extremely schematically represented in the figure as a three-dimensional network of silicon and oxygen atoms and their bonds. Note that the silicon-oxygen bond lengths are on the order of a nanometer in comparison to the tens of micrometers for the gap. The silicate glass 36 may be referred to as silica having a composition of approximately silicon dioxide ($SiO_2$) and forms as an amorphous solid with most silicon atoms bonding to four oxygen atoms and most oxygen atoms bonding to two silicon atoms. The figure shows oxygen atoms bonding to silicon atoms in the silicon members 30, 32 at the silicon surfaces 38, 40. However, the structure is in reality more complex since the silicon members 30, 32 likely have a thin native oxide layer, that is, of $SiO_2$ at their surfaces 38, 40. The vitrification anneal rearranges some of the oxide bonds to bond instead to oxygen or silicon atoms in the silica glass 36.

Silicon towers produced by this method have delivered superior performance in several applications. Nonetheless, the bonded structure and in particular the bonding material may still be excessively contaminated, especially by heavy metal. The very high temperatures experienced in the use or cleaning of the silicon towers, sometimes above 1300° C., may worsen the contamination. One possible source of the heavy metals is the relatively large amount of SOG used to fill the joint between the members to be joined. Siloxane SOG is typically cured at around 400° C. when used in semiconductor fabrication, and the resultant glass is not usually exposed to high-temperature chlorine. However, it is possible that the very high temperature used in curing a SOG adhesive draws out the few but possibly still significant number of heavy metal impurities in the SOG.

Furthermore, the joints joined by SOG adhesive have not proved as strong as desired. Support towers are subject to substantial thermal stresses during cycling to and from high temperatures, and may be accidentally mechanically shocked over extended usage. It is greatly desired that the joints not determine the lifetime of the support tower.

SUMMARY OF THE INVENTION

Two parts, particularly silicon structural members, may be joined with an adhesive including silicon powder entrained in a silica bridging agent that forms a silica or other silicate glass when annealed at an elevated temperature. The invention may advantageously be used to fabricate a substrate support tower or other part used in a semiconductor processing reactor.

In one embodiment, the silicon powder is milled or otherwise formed from virgin polysilicon. In another embodiment, the silicon powder is grown as very small particulates in a chemical vapor deposition (CVD) process. The milled powder preferably has a particle size of less than 100 μm, preferably between 1 and 50 μm. The CVD powder may have a much smaller size, for example, generally spherical shapes with particle sizes less than 100 nm, for example, having a distribution peaking at between 15 and 25 nm.

The bridging agent may be a spin-on glass used in forming oxide dielectric layers during semiconductor fabrication. A retardant may be added to the mixture to slow setting at room temperature. Advantageously, the CVD powder does not require a retardant. The mixture is applied to the joining areas, the members are assembled, and the structure annealed at a temperature sufficient to form a silicon-oxygen network. The annealing temperature is generally above 400° C. When milled silicon powder is used to form silicon fixtures for supporting wafers or other wafer processing equipment, the annealing temperature is preferably above 1200° C. and more preferably at least 1300° C. However, the CVD powder allows annealing at 1100° C. and below.

Other silica bridging agents may be used.

Nano-silicon powder facilitates the design of support towers having legs and corresponding mortise holes in the bases with shapes having an arcuate back on a side away from a narrower tip, wherein the ends of the legs can be tightly fit within the mortise holes.

Such silicon/silica composite adhesives may be advantageously used to form larger parts from smaller silicon pieces, for example, a plate from multiple bars or a tube from multiple staves as in a barrel.

The invention includes the joined structure and the adhesive used in the joining.

DETAILED DESCRIPTION OF THE PREFERRED EMBODIMENTS

The purity level of a silica adhesive, particularly when used to join silicon structural members, can be improved by embedding silicon powder within a silica matrix. The powder is typically composed of silicon crystallites. As a result, a much reduced amount of the silica bonds not only to the silicon structural members but also to the silicon powder. The high purity level of virgin polysilicon (virgin poly) is well known and is one of the reasons for its use as the structural legs of a wafer tower. Milled virgin poly may also be advantageously used as part of the bonding agent in joining the parts of a silicon tower. Alternatively, silicon particulates may be directly grown, for example, by chemical vapor deposition.

In one embodiment of the invention, virgin poly is ground or milled to a fine powder. Milled powdered virgin poly is available from MEMC in three size grades: less than 1 μm; between 1 and 75 μm; and between 75 and 125 μm. The largest size is too large for typical joints. The finest size is probably usable, but such small silicon powder can be explosive because of the large heat of enthalpy of silicon dioxide. The medium size still contains particles too large for the joint. Nonetheless, it or possibly the large-sized powder can be ground before use to a smaller maximum size, preferably using a silicon pestle and silicon mortar. It is estimated that the particle size after grinding is less than 325 mesh, that is, a maximum diameter of less than approximately 75 μm. Such a size conforms to the size of the gap.

The silicon powder is then mixed with a silica bridging agent, such as a spin-on glass (SOG) to form a low viscosity liquid. At a minimum, the mixture should be able to flow. The term "flow" should be used in a wide sense of being able to deform to fill a space as force or pressure is applied to it. It preferably forms a continuous medium, such as a liquid, slurry, or thixotropic dispersion. It also preferably wets the two surfaces so as to stick to them. Proportions of about 3 parts milled silicon powder and 1 part bridging agent are typical. The liquid is applied to at least one of the mating surfaces of the two silicon parts to be joined and wets to it. A plastic knife can be used to apply a few drops to the joint area. Utensils and containers having even low levels of heavy metals should be avoided. The silicon parts are not roughened or intentionally oxidized prior to bonding.

Figure 4:
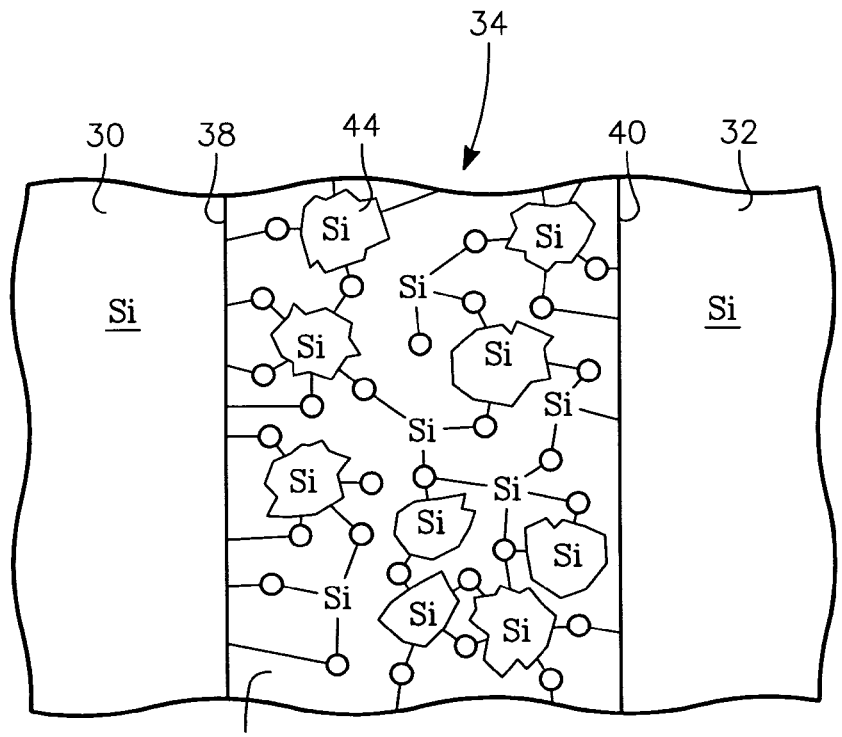
FIG. 4 is a schematic illustration in cross of two silicon members joined together by an inventive composite of silicon particles and a spin-on glass.

The silicon parts 30, 32 are then assembled and annealed to produce the general structure schematically represented in FIG. 4, in which silicon crystallites 44 of irregular shape fill a substantial fraction of the gap 34 between the parts 30, 32. A silicate glass 46 is formed from the silica bridging agent and bonds the silicon crystallites 44 to each other and to the silicon parts 30, 32. Again, the illustration is vastly out of scale since the silicon crystallites 44 have a size on the order of ten micrometers while the silicon-oxygen bonds have a size on the order of a nanometer. Further, the silicon crystallites 44 are likely to contact each other with the silica glass matrix 46 filling the interstices.

The composite of silicon powder and silica has several advantages. Since the milled silicon powder may be formed of virgin poly, it has a very high purity level. Since the silicon powder forms a large fraction of the final solid, sometimes up to 90%, the fraction of the remaining SOG glass is that much smaller, typically 11% or less. A silica content of 7% has been found satisfactory. Further, the effective coefficient of thermal expansion of the bonding agent in the joint is determined primarily by the silicon particles. As a result, the differential thermal expansion is reduced between the silicon structural members and the joint. Furthermore, the joints between silicon structural members typically are much thicker than the micrometer thicknesses typical of semiconductor dielectric layers for which commercial SOGs have been developed so that such a SOG used as an adhesive is much thicker than was intended for the SOG. The inclusion of the silicon powder significantly reduces average silica thicknesses within the matrix to values closer to semiconductor structures.

EXAMPLE 1

A spin-on glass, FOx® 17 spin-on glass available from Dow Chemical, contains about 22% solid. It was mixed with milled virgin polysilicon powder and the mixture was coated on unoxidized silicon test samples. The bond was good. However, the mixture set up within a few minutes at room temperature (22° C.), far too quickly for use in assembling silicon towers which require careful jigging in the annealing furnace to achieve proper alignment of the parts.

EXAMPLE 2

Pine oil was used as a retardant to slow the initial setting. Pine oil is commercially available from Hercules as Yarmor® 302 Pine Oil. It contains at least 85% terpene alcohols and very little water. It is soluble in organic solvents but much less soluble in water. The water content is less than 1% by volume. A 50:50 mixture of FOx 17 spin-on glass and pine oil was prepared. The mixture was combined with the milled silicon powder and applied to the area of the joint between unoxidized silicon test samples. It set up in about 2 to 3 hours, a satisfactory time for assembly. When annealed at 1200° C. for four hours, it produced a bond that was stronger than the silicon structural member. A somewhat higher annealing temperature of at least 1300° C. is preferred. A typical annealing sequence is a 6-hour ramp up, a 3-hour hold, and a 3-hour ramp down. Both the spin-on glass liquid and the milled virgin poly powder need to be fairly fresh.

EXAMPLE 3

Another spin-on glass, Honeywell 512B spin-on glass, typically used in semiconductor fabrication, was substituted for the FOx 17 spin-on glass in the previous example. Similar results were obtained although the 512B sets up more quickly than the FOx 17 spin-on glass.

EXAMPLE 4

Terpineol is a terpene alcohol which is a pure form of pine oil having three isomeric forms of chemical composition $C_{10}H_{17}OH$. Terpineol 318 Prime Terpene Alcohol is available from Hercules with 98% tertiary alcohol content and less than 0.6% moisture. Its heavy metal impurities are believed is less than about 1 ppm. A colloidal sol was prepared in the ratio of 1:0.5:3 parts by weight of FOx 17 spin-on glass SOG precursor, terpineol, and milled silicon powder respectively. This mixture is expected to produce a cured composite of 7½% silica and 92½% silicon. The mixture was applied to silicon test samples, which were joined and then annealed. The annealing sequence in one experiment included a ramp up to about 1000° C. and then an uncontrolled cooling. Nonetheless, the test samples were firmly bonded by the shorter, lower-temperature anneal.

EXAMPLE 5

Two aqueous colloidal silica sols were evaluated. Fujimi HP 20 is a colloidal sol having about 17½% solid content of silica. Syton HT 50 is a water borne suspension of colloidal silica used as a wafer polishing compound. It has a silica content of about 50%. These colloidal silica bonding agents also chemically react to form the silicate glass. Because the gel is alkaline with a pH of about 10.6, the surface of the silica particulates are hydrolyzed to Si—OH, which then bridges to Si—O—Si in the silica network.

Each of the colloidal silica gels was mixed with milled powdered silicon. When applied to unoxidized silicon test samples, each mixture provided a very strong bond after a minimum annealing temperature of 1200° C. However, both of these set up in less than 30 minutes at room temperature, a marginally acceptable time without the use of retardants.

An important characteristic of the adhesive is its bonding strength between two silicon members. A testing method has been developed. Two generally rectangular silicon rods having a transverse size of about 1 cm have flat ends with a smooth machined finish, about 32 micro-inches (0.8 µm) of surface roughness. The composite adhesive was applied to the ends, which were pressed together and annealed. The two rods were then torqued along a longitudinal axis till they broke. Most of the samples described above with 25 µm polysilicon powder broke when hand torqued, which corresponds to a torque of less than 100 lb/cm. Above this torque level, a more quantitative method was used involving clamping one of the joined members and applying a known force on the other cantilevered member at a fixed distance from the joint. Such strengths are marginally acceptable for structures.

It is believed that one of the problems of low joint strength is that the 25 µm powder cannot penetrate into surface irregularities of lesser size, for example, the 0.8 µm smooth machined surfaces. Attempts to grind the polysilicon powder to a finer size were able to obtain a powder that passed a 500 mesh, but none would pass a 800 mesh. This indicated a minimum milling size of about 20 µm. As a result, it is believed that only the protruding portions of the machined surface is closely bonded to the large silicon particles.

Figure 5:
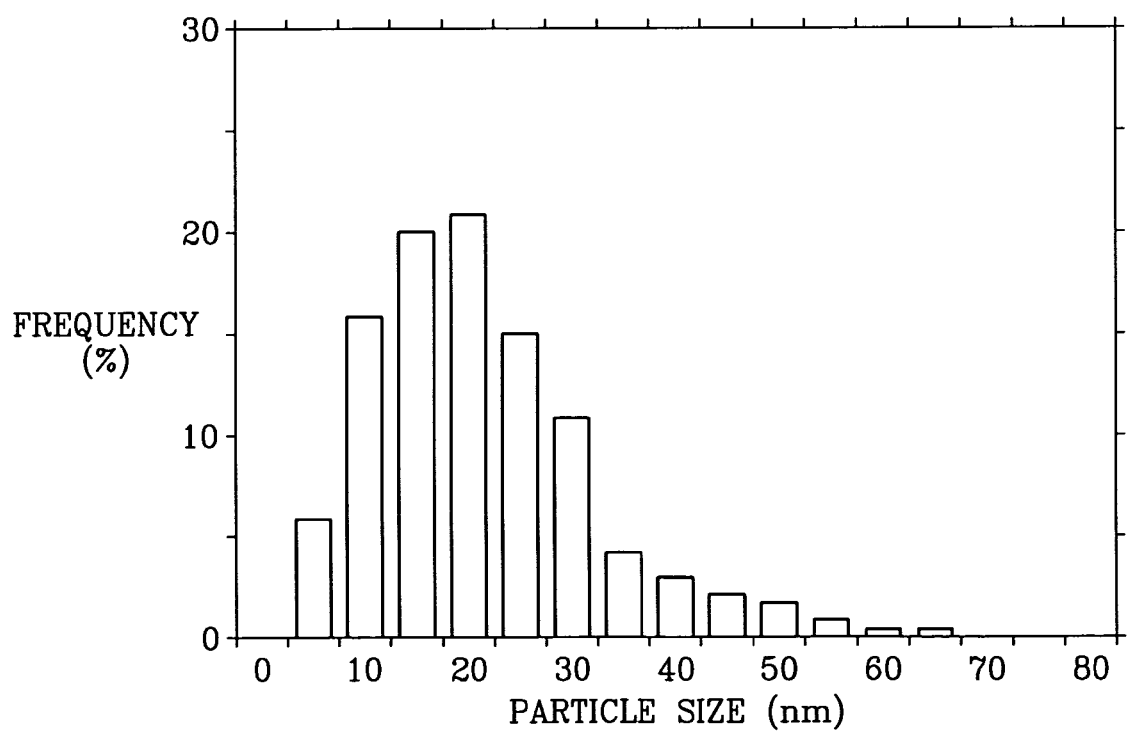
FIG. 5 is a graph of the particle size distribution for nano-silicon particles.
Figure 3:
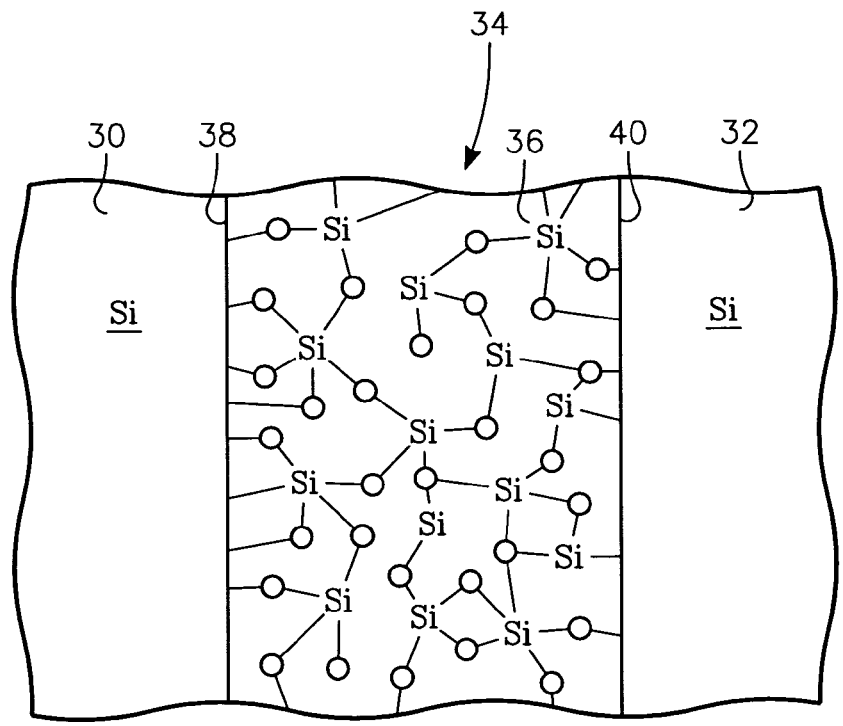
FIG. 3 is a schematic illustration in cross section of two silicon members joined together by a spin-on glass, as practiced in the prior art.

An alternative type of fine silicon powder is formed directly from ultra-pure silane in the presence of hydrogen. Ingots of virgin polysilicon are formed by a similar CVD process but a hot seed rod is used there to nucleate the ingot and thermally activate the decomposition of the silane precursor. The process in the absence of the seed forms silicon particles of generally spherical shape although they may be better characterized as faceted octahedral shapes expected of crystalline silicon. Two crossing laser beams can be used to provide the CVD activation energy. Such a CVD silicon powder is commercially available as NanoSi™ Polysilicon from Advanced Silicon Materials LLC of Silver Bow, Mont. The particle size distribution illustrated in FIG. 5 shows that at least 99% of all CVD particles have diameters of less than 100 nm, at least 90%, less than 50 nm, and a median size of between 10 and 25 nm. As a result, the fine silicon powder may be described as nano-particulates or nano-silicon. According to the manufacturer's product information bulletin, care should be taken in handling such fine powder in dry form because of its explosive nature and possible medical effects upon inhalation by the user. Alternative methods for directly forming silicon particles include pulsed laser ablation of a virgin poly rod.

Such fine spherically shaped powder offers both a very large surface area per unit volume or weight, and 25 nm particles are easily accommodated within the 800 nm surface roughness. Small silicon particles also offer short SOG bonding lengths when used as in a SOG composite adhesive.

EXAMPLE 6

The nano-silicon was substituted for the milled silicon powder in one of the above mentioned recipes with recipe of 3:1:1 of FOx 17 spin-on glass, silicon powder, and terpineol by weight. The strength tests indicated a significantly stronger bond than using milled silicon. The adhesive also seemed to take somewhat longer to set up at room temperature and to cure at a lower annealing temperature. The joints, when broken, showed a whitish-grey color different from the blacker color when the milled silicon powder was used.

EXAMPLE 7

In view of the positive trend with using nano-silicon powder, another series of tests was performed using a recipe of 3:1 of FOx and nano-silicon powder, that is, no terpineol or other retardant. The adhesive was observed to set up in about 15 minutes, significantly more than the minutes with milled silicon powder without a retardant. The 15 minute setting time is considered sufficient to assemble and align a structure. The adhesive was annealed at 1100° C. in air for between 15 and 20 hours. The final composition of the cured adhesive is estimated to be 60% silicon and 40% $SiO_2$ by weight although the local chemical composition at this time is not clear.

Six test structures were fabricated and tested for joint strength. Five of the structures included pairs of virgin polysilicon bars or rectangular rods. The break strengths were measured at 170, 374, 417, 561, and 714 lb/cm respectively. The rod ends at the fractured joints were inspected. All five virgin poly structures showed a fairly uniform and smooth grey surface with perhaps some chip-like areas at the corner indicating cleavage of the underlying silicon rather than of the bond. The weakest structure was observed to contain a protrusion matching a corresponding feature across the joint and having a size of perhaps a hundred microns. It is believed that the protrusion prevented the otherwise smooth surfaces from being joined in close proximity. That is, the adhesive was excessively thick in this case. The sixth test structure included one virgin polysilicon rod and one crystalline Czochralski rod. The break strength was 680 lb/cm. The broken joint indicated that the underlying crystalline material broke on Czochralski cleavage planes, and that the adhesive did not break.

It is believed that these results show a superior bond based on the following mechanisms. The absence of terpineol removes a potential source of contaminants. The very small silicon particulates allow the adhesive to penetrate into the moderately rough silicon surfaces and bond across a large fraction of the joint interface. Furthermore, the two silicon members may be pressed very close to each other during the bonding and curing process. As a result, the total adhesive thickness is reduced, which should increase the bond strength. The nano-particles provide a very high surface-to-volume ratio for the silicon so the silicon is highly reactive with the silica bridging agent. Further, the reduced amount of adhesive fractionally reduces the effect of possible contamination from the SOG. The reduced annealing temperature of 1100° C. is considered superior for several reasons over the 1300° C. which that was often used with composite adhesives using milled silicon powder. At the lower temperature, metal portions of the furnace are less prone to failure and expel lower levels of contaminants. Annealing furnaces often use quartz liners, which also expel high levels of contaminants at the higher temperature and are subject to sag. Some tests have shown that the amount of iron contaminants is reduced by almost a factor of 100 by reducing annealing temperatures from 1300° C. to 1000° C.

The nature of the cured adhesive of SOG and silicon nano-particles has not been definitely determined. The product literature for the nano-silicon powder indicates an oxygen content of about 2½ wt %. That would amount to about an atomic layer of oxygen covering the 20 nm silicon nano-particles. Such a covering prior to adhesive curing can be characterized as having a chemical composition of $SiO_x$, where x would range between 0.5 and 2. Curing of SOG would likely cause the surface oxygen and the SOG oxygen to penetrate into the nano-particle. As a result, the cured composite may have a chemical composition primarily of $SiO_x$. In many circumstances, silica is observed to have a higher strength than crystalline silicon.

Figure 1:
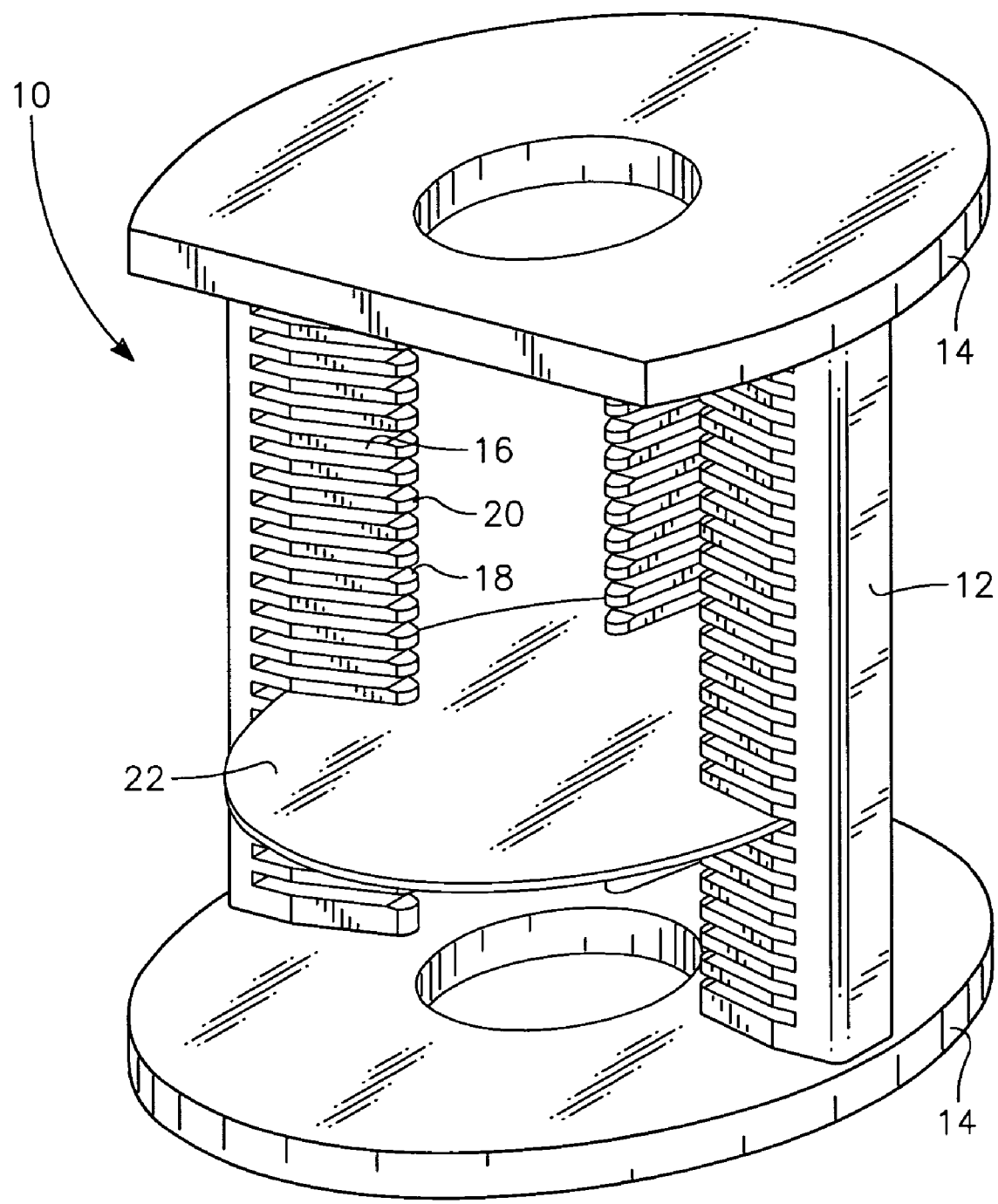
FIG. 1 is an orthographic view of a silicon wafer tower.
Figure 2:
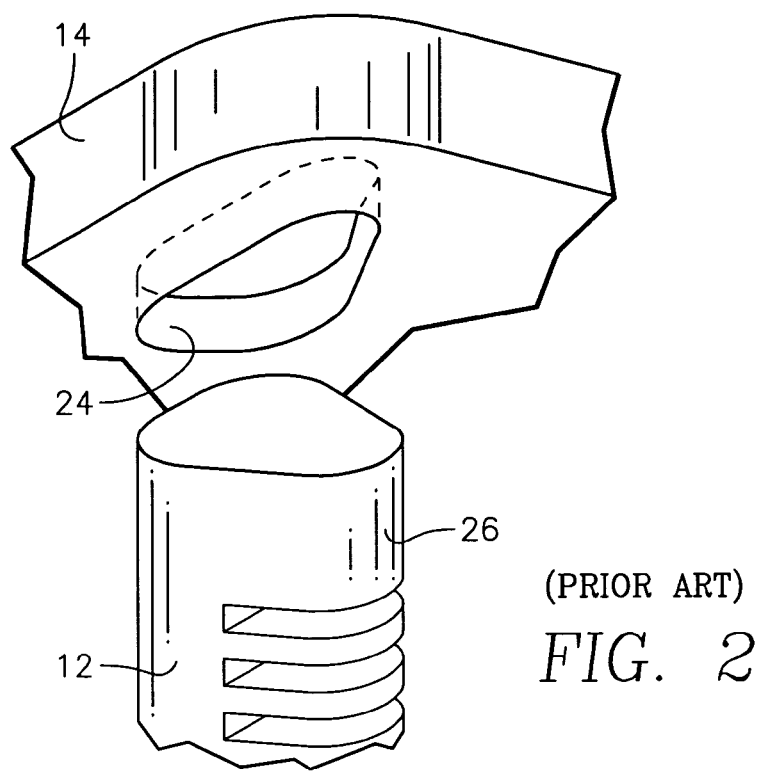
FIG. 2 is an orthographic view of two members of the tower and how they are joined.

The use of silicon nano-particles in the adhesive allows modification of the large-scale structure itself. Conventionally, as illustrated in FIGS. 1 and 2, the tower legs have been formed with flat backs, which were believed to be provide better bonding across a large area. However, the mechanical strength of acutely shaped structures is inferior to smoothly shaped structures. An improved leg 50 illustrated in axial cross-section in FIG. 6 has a narrow arcuate tip 52 at its front side. Unillustrated support teeth are machined in the support section of the leg 50 between unmachined ends used as tendons inserted into corresponding mortise holes in the bases. Support areas are machined onto the teeth at the narrow tip 52. The arcuate tip 52 is tangentially joined to two inclined straight sides 54, 56 inclined with respect to each other by about 5 to 20° to taper outwardly toward the back side. A wide arcuate back 58 tangentially joins the two inclined sides 54, 56 and continuously curves across the medial plane 60 of the leg 50. It preferably has a circular shape, which in this embodiment extends for greater than 180°. The illustrated shape is fit into corresponding mortise holes in the silicon bases and may be bonded to the bases it by the composite adhesive of the invention. With the use of nano-silicon powder, the arcuate back 58 may be tightly fit into the corresponding portion of the base mortise hole with only a very small layer of adhesive filling the gap.

Figure 6:
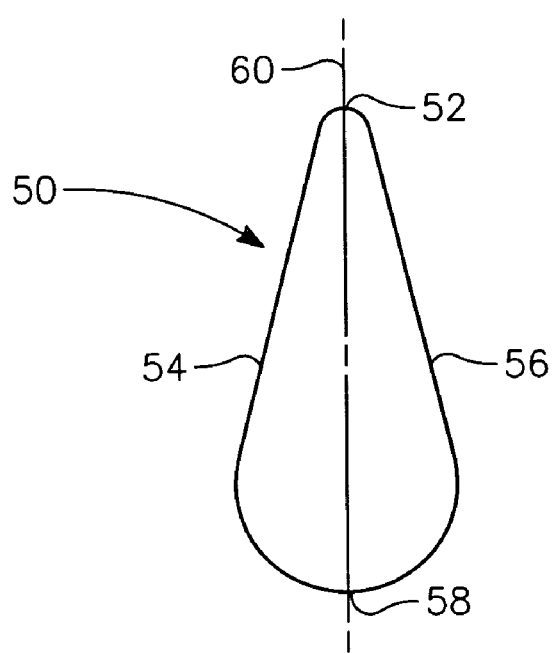
FIGS. 6 and 7 are axial cross-sectional view of two leg shapes.
Figure 7:
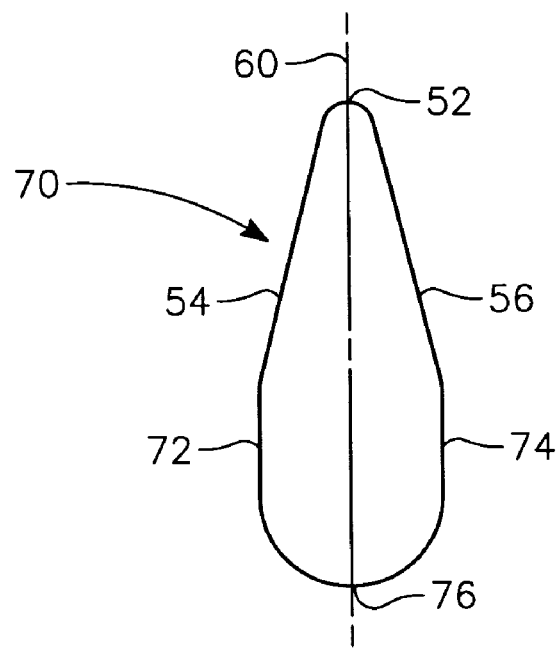

An improved leg 70 of a second embodiment illustrated in the axial cross-section of FIG. 7 is similar except that two second straight portions 72, 74 are smoothly joined to the inclined straight sides 54, 56 and tangentially connected to an arcuate back 76, which may have a somewhat smaller size than the back 58 of FIG. 6, but still curves continuously across the medial plane 60. Preferably, the second straight portions 72, 74 are parallel to each other, in which case if the back 76 is circular, it extends for 180°. In either embodiment, more complicated shapes of the arcuate portions 52, 58, 76 are possible, especially for the narrow tip 52.

The curved backs 58, 76 improve the mechanical shape while the nano-silicon composite adhesive allows close fitting of the leg shape to the mortise holes.

The invention may be extended to silicate-like oxides based only partially on $SiO_2$, for example, benzocyclobutene (BCB), which forms from Cyclotene® 3022-63, available form Dow Corning for forming low-k dielectrics. In some forms, the polymeric BCB forms a three-dimensional network of napthalene and siloxane, itself having an Si—O—Si unit. It is known to withstand very high temperatures.

Although the silicon/silica composite adhesive reduces unwanted contamination, the silica-containing adhesive can be completely sealed from the exterior by plasma spraying a layer of silicon over the joint, as Boyle et al. have described in U.S. patent application Ser. No. 10/602,299, filed Jun. 24, 2003, now issued as U.S. Pat. No. 6,074,693, incorporated herein by reference in its entirety. A CVD sealant layer would be effective as well though more difficult to apply to a larger structure.

In semiconductor fabrication, the spin-on glasses are typically first heated to 200° C. to evaporate the solvents and then cured at 400° C. to form the silica network. Such temperatures can be used to join the silicon parts. However, a higher temperature of 1000° C. and preferably at least 1200° C. assures the formation of the silica network across larger spans and more reaction with the underlying silicon or silicon oxide. It is recommended that a tower to be used for high-temperature processes, for example, above 1250° C., have its bonding layer be annealed at that temperature or above. We have found that a 1300° C. anneal of the assembled silicon parts provides a good solid joint when using milled silicon powder. However, only 1100° C. is known to provide even better results with nano-silicon powder. Even lower annealing temperatures with nano-silicon may be possible. It is believed that 900° C. is a reasonable lower limit for annealing, especially for reasonable annealing times. However, even lower annealing temperatures are possible if increased annealing times are accepted.

The invention has been applied to both oxidized and non-oxidized silicon parts. It seems to work equally well for both.

The SOG described above as an exemplary silica bridging can be characterized as principal comprising silicon and oxygen linked through Si—O—Si bonding. A larger class of materials capable of forming silicate and similar glass are silicone-containing materials of the general class Si—O—R, where R is an organic group. Silicones are most often used as lubricants but also find many other uses.

The bonding of the invention is not limited to virgin poly parts. Different types of silicon may be bonded together. For example, the tower of FIG. 1 includes virgin poly legs and Czochralski or cast silicon bases bonded together. The bonding process may also be advantageously used with non-silicon but silicon-containing materials, for example, quartz, silicon carbide, and silicon-impregnated silicon carbide. However, a silicon part will be understood, unless stated otherwise, as comprising no more than 5 wt % of non-silicon elements.

Although milled virgin poly powder or CVD nano-silicon offer high purity levels, other types of silicon powder of lesser purity may be used in view of their limited amount, mostly enclosed volumes, and distance from the wafers being supported on the assembled tower. However, the silicon powder should have a impurity level of preferably no more than 1 part per million and with the alkali and heavy metals being eliminated as much as possible. The maximum size of the silicon powder needs to be less than the nominal size of the gap, which is usually less than 100 μm, although the more typical value is 50 μm or somewhat less. The minimum size of at least half the powder should be high enough to produce a relatively high ratio of volume to surface, for example, at least 5 μm and preferably at least 10 μm. Excess amounts of very small particulates must be handled carefully to avoid ignition or explosion.

The ratios of the silicon powder to the silica-forming liquid can be experimentally determined. Weight ratios of 1:4 to 4:1 provide a reasonable range. Although the percentage volume of silica to unreacted silicon is preferably low, values of 50% or even higher enjoy benefits of the invention. Particularly for the larger milled silicon powder, the silicon powder volume should be greater than 50% and preferably greater than 85%.

Retardants are not essential to the invention as long as the silica/silicon composite does not set too quickly. When required, retardants are not limited to pine oil or terpineol. It is believed that the retardant primarily acts to dilute the SOG silica bridging agent. Other alcohols could likely be substituted for the terpene alcohols. Any moisture seems to accelerate the initial setting so that water insoluble solvents are preferred but not required. Polyhydroxy alcohols such as glycol and glycerol could also be substituted despite their water solubility. Further, the solvent should volatize above room temperature but below the temperature at which the SOG cures, typically at 400° C. for many commercial SOGs. The ratio of silica bridging agent to retardant forming the liquid depends on the bridging agent and the retardant, if any is needed. Weight ratios between 1:2 and 2:1 have proven useful for spin-on glasses.

The invention has been described in the context of silicon towers, but other structures can benefit from the invention. Silicon boats have similar requirements. Other parts of semiconductor fabrication chambers benefit from the use of silicon parts, often of extensive size, such as chamber walls. The invention can be applied to fabricating these parts from smaller silicon sub-parts.

Figure 8:
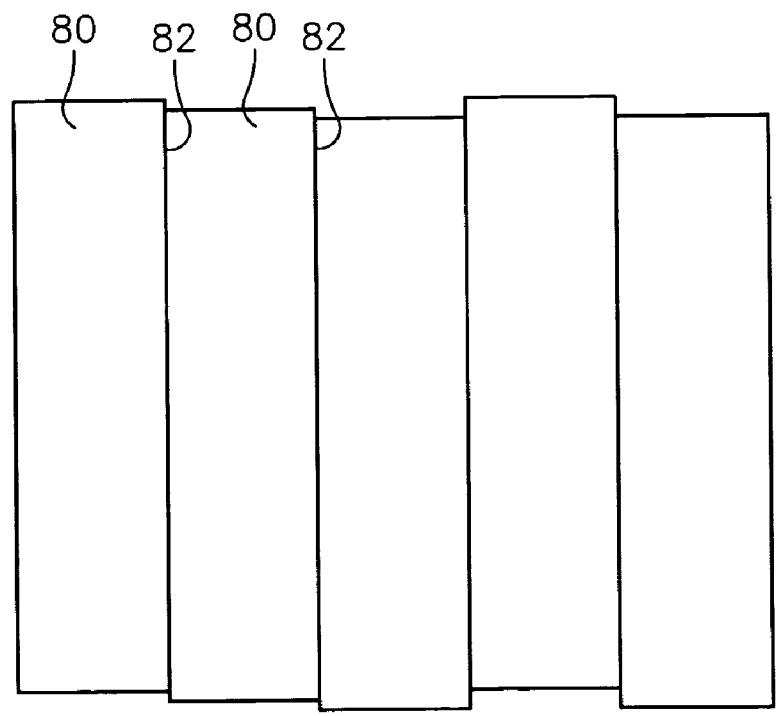
FIG. 8 is a plan view illustrating a method of forming a larger silicon plate from smaller silicon bars.

In particular, composite adhesives including nano-silicon powder can be advantageously used to join smaller silicon members to form nearly seamless larger members. For example, the bases 14 of FIG. 1 have a size exceeding the currently available size of virgin polysilicon. Nonetheless, as illustrated in the plan view of FIG. 8, a number of smaller rectangular silicon bars 80 extending along respective axes are laterally juxtaposed with the silicon/silica composite adhesive filling seams 82 between neighboring members 80. All the members 80 can be glued together in a single operation using a single clamping mechanism to minimize the gap at the seams 82. The facing sides of the silicon members 80 may be polished to further reduce the size of the seam gaps. The bars could be stacked in a two-dimensional arrays to form a thicker body. After assembly and at least partial curing, the structure is annealed to cure the SOG. After curing, the members 80 are tightly and strongly joined to each other. Thereafter, the structure may be machined to the desired shape, for example, a round base with a central aperture and mortise holes for the legs. Other shapes, such as etch reactors showerheads having a generally circular shape and a large number of axial showerhead nozzles, are all encompassed within the invention. In particular, the adhesive of the invention may be used to form silicon tubes by bonding together silicon staves, as has been described by Zehavi et al. in U.S. patent application Ser. No. 09/965,106, filed Sep. 26, 2001, now abandoned in favor of U.S. patent application Ser. No. 10/642,013, filed Aug. 15, 2003, now issued as U.S. Pat. No. 7,137,547, incorporated herein by reference in its entirety. Smaller tubes, such as injectors, can be formed by bonding together two half tubes of machined silicon.

The invention thus allows silicon parts, particularly those of very high purity, to be joined to form a structure having high strength but exhibiting very low impurity levels. The method uses commonly available materials and is easily and economically practiced.

The invention claimed is:

1. A substrate support fixture, comprising:
   a plurality of silicon legs including teeth for supporting a plurality of substrates in parallel orientations;
   two silicon bases joined to opposing ends of the legs across respective joints with respective gaps between a respective one of the bases and a respective one of the legs;
   silicon crystallites having sizes of less than 100 μm occupying at least 50% of the gaps; and
   a silica network in each of the gaps joining and adhering the silicon crystallites and the legs and the bases.

2. The fixture of claim 1, wherein the sizes are between 1 and 75 μm.

3. The fixture of claim 1, wherein the silicon crystallites have a size distribution with at least 99% of particles having a size of less than 100 nm.

4. The fixture of claim 1, wherein the legs comprise an arcuate back side opposite the tips of the teeth supporting the substrates.

5. The fixture of claim 1, wherein the silicon crystallites have at least interiors consisting essentially of silicon.

6. A silicon assembly comprising at least two silicon parts bonded together along respective joining areas by the method of:
   providing a mixture of a powder consisting essentially of silicon and a chemical which when annealed to an annealing temperature vitrifies to form a silicate glass;
   applying the mixture to at least one of the joining areas;
   assembling the at least two silicon parts with the respective joining areas in juxtaposition; and
   annealing the assembled parts at the annealing temperature to thereby bond the parts together, wherein the at least two silicon parts include two silicon bases and at least three silicon legs bonded on ends thereof to the silicon bases and including teeth formed therein for supporting a plurality of substrates in a stacked arrangement.

7. The assembly of claim 6, wherein the silicon parts consist essentially of silicon.

8. A substrate support fixture, comprising:
   a plurality of silicon legs including teeth for supporting a plurality of substrates in parallel orientations;
   two silicon bases joined to opposing ends of the legs across respective joints with respective gaps between a respective one of the bases and a respective one of the legs; and
   a composite bridging each of the gaps, adhering the parts together, and comprising silicon crystallites having a least interiors consisting essentially of silicon, embedded in a matrix of silica, and occupying at least 50% of each of the gaps.

9. The fixture of claim 8, wherein the silicon crystallites have sizes of less than 100 microns.

10. The fixture of claim 8, wherein the silica comprises no more than 11% of the composite.

11. A substrate support fixture, comprising:
    a plurality of silicon legs including teeth for supporting a plurality of substrates in parallel orientations;
    two silicon bases joined to opposing ends of the legs across respective joints with respective gaps between a respective one of the bases and a respective one of the legs;
    a silica network bridging the respective gap; and
    silicon particles having at least interiors consisting essentially of silicon embedded in the matrix and occupying at least 50% of the respective gap.

12. The fixture of claim 11, wherein the silicon particles have sizes of less than 100 microns.

* * * * *